(12) United States Patent
Washizu et al.

(10) Patent No.: US 7,973,584 B2
(45) Date of Patent: Jul. 5, 2011

(54) WAVEFORM GENERATOR

(75) Inventors: Nobuei Washizu, Tokyo (JP); Hiroaki Tateno, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/668,657

(22) PCT Filed: Sep. 4, 2008

(86) PCT No.: PCT/JP2008/002443
§ 371 (c)(1),
(2), (4) Date: Jan. 11, 2010

(87) PCT Pub. No.: WO2010/026616
PCT Pub. Date: Mar. 11, 2010

(65) Prior Publication Data
US 2010/0194460 A1    Aug. 5, 2010

(51) Int. Cl.
*G06F 1/04* (2006.01)
*H03K 3/00* (2006.01)
(52) U.S. Cl. ........ 327/291; 327/164; 327/166; 327/292; 327/293; 327/294; 702/70; 702/73; 702/124
(58) Field of Classification Search .................. 327/172, 327/276, 291; 702/70, 73, 124
See application file for complete search history.

(56) References Cited

U.S. PATENT DOCUMENTS

| | | | | |
|---|---|---|---|---|
| 7,439,787 B2 * | 10/2008 | Hashim et al. | ................ | 327/172 |
| 2010/0049453 A1 * | 2/2010 | Watanabe et al. | ............... | 702/58 |

FOREIGN PATENT DOCUMENTS

| | | |
|---|---|---|
| JP | 10-232271 | 9/1998 |
| JP | 11-202028 | 7/1999 |
| JP | 11-304888 | 11/1999 |
| JP | 2000-039469 | 2/2000 |
| JP | 2006-112873 | 4/2006 |
| JP | 2007-121072 | 5/2007 |
| WO | WO 2006/035647 A1 | 4/2006 |

OTHER PUBLICATIONS

PCT International Preliminary Report on Patentability issued in PCT Application No. PCT/JP2008/002443 mailed on Mar. 8, 2011, with its English-language translation.

* cited by examiner

*Primary Examiner* — Lincoln Donovan
*Assistant Examiner* — John W Poos
(74) *Attorney, Agent, or Firm* — Ladas & Parry, LLP

(57) ABSTRACT

Timing setting data include an arbitrary combination of a set timing signal indicating a positive edge timing and a reset timing signal indicating a negative edge timing. A sort unit sorts n pieces of the timing setting data in accordance with timing orders indicated by each of the timing setting data. With reference to the sorted timing setting data an open processor detects continuation of the set timing signals or continuation of the reset timing signals, and invalidates one of the continuous set timing signals or one of the continuous reset timing signals. An edge assigning unit sequentially assigns the set/reset timing signals remaining without being invalidated to, among the m variable delay circuits for setting/resetting, the variable delay circuits for setting/resetting in the ascending order of the frequencies of use thereof by then.

6 Claims, 8 Drawing Sheets

FIG.6

| | INPUT | | | | | | | | | ASSIGNED PLACE | | | | | | | |
|---|---|---|---|---|---|---|---|---|---|---|---|---|---|---|---|---|---|
| CNT | TS1 | TS2 | TS3 | TS4 | TS5 | TS6 | TS7 | TS8 | CNT | TS1 | TS2 | TS3 | TS4 | TS5 | TS6 | TS7 | TS8 |
| S1 | - | - | - | - | - | - | - | - | S1 | - | - | - | - | - | - | - | - |
| S1 | S | - | - | - | - | - | - | - | S1 | * | - | - | - | - | - | - | - |
| S1 | R | - | - | - | - | - | - | - | R1 | R1 | - | - | - | - | - | - | - |
| S1 | - | S | - | - | - | - | - | - | S1 | - | * | - | - | - | - | - | - |
| S1 | S | S | - | - | - | - | - | - | S1 | * | * | - | - | - | - | - | - |
| S1 | R | S | - | - | - | - | - | - | S2 | R1 | S2 | - | - | - | - | - | - |
| S1 | - | R | - | - | - | - | - | - | R1 | - | R1 | - | - | - | - | - | - |
| S1 | S | R | - | - | - | - | - | - | R1 | * | R1 | - | - | - | - | - | - |
| S1 | R | R | - | - | - | - | - | - | R1 | R1 | - | - | - | - | - | - | - |
| S1 | - | - | S | - | - | - | - | - | S1 | - | - | * | - | - | - | - | - |
| S1 | S | - | S | - | - | - | - | - | S1 | * | - | * | - | - | - | - | - |
| S1 | R | - | S | - | - | - | - | - | S2 | R1 | - | S2 | - | - | - | - | - |
| S1 | - | S | S | - | - | - | - | - | S1 | - | * | * | - | - | - | - | - |
| S1 | S | S | S | - | - | - | - | - | S1 | * | * | * | - | - | - | - | - |
| S1 | R | S | S | - | - | - | - | - | S2 | R1 | S2 | * | - | - | - | - | - |
| S1 | - | R | S | - | - | - | - | - | S2 | - | R1 | S2 | - | - | - | - | - |
| S1 | S | R | S | - | - | - | - | - | S2 | * | R1 | S2 | - | - | - | - | - |
| S1 | R | R | S | - | - | - | - | - | S2 | R1 | * | S2 | - | - | - | - | - |
| S1 | - | - | R | - | - | - | - | - | R1 | - | - | R1 | - | - | - | - | - |
| S1 | S | - | R | - | - | - | - | - | R1 | * | - | R1 | - | - | - | - | - |
| S1 | R | - | R | - | - | - | - | - | R1 | R1 | - | * | - | - | - | - | - |
| S1 | - | S | R | - | - | - | - | - | R1 | - | * | R1 | - | - | - | - | - |
| S1 | S | S | R | - | - | - | - | - | R1 | * | * | R1 | - | - | - | - | - |
| S1 | R | S | R | - | - | - | - | - | R2 | R1 | S2 | R2 | - | - | - | - | - |
| S1 | - | R | R | - | - | - | - | - | R1 | - | R1 | * | - | - | - | - | - |
| S1 | S | R | R | - | - | - | - | - | R1 | * | R1 | * | - | - | - | - | - |
| S1 | R | R | R | - | - | - | - | - | R1 | R1 | * | * | - | - | - | - | - |
| S1 | - | - | S | R | S | R | S | R | R3 | - | - | * | R1 | S2 | R2 | S3 | R3 |
| S1 | S | - | S | R | S | R | S | R | R3 | * | - | * | R1 | S2 | R2 | S3 | R3 |
| S1 | R | - | S | R | S | R | S | R | R4 | R1 | - | S2 | R2 | S3 | R3 | S4 | R4 |
| S1 | - | S | S | R | S | R | S | R | R3 | - | * | * | R1 | S2 | R2 | S3 | R3 |
| S1 | S | S | S | R | S | R | S | R | R3 | * | * | * | R1 | S2 | R2 | S3 | R3 |
| S1 | R | S | S | R | S | R | S | R | R4 | R1 | S2 | * | R2 | S3 | R3 | S4 | R4 |
| S1 | - | R | S | R | S | R | S | R | S4 | - | R1 | - | S2 | R2 | S3 | R3 | S4 |
| S1 | S | R | S | R | S | R | S | R | S3 | R1 | S2 | R2 | S3 | R3 | S4 | R4 | S3 |
| S1 | R | R | S | R | S | R | S | R | R4 | R1 | * | S2 | R2 | S3 | R3 | S4 | R4 |
| S1 | - | - | R | R | S | R | S | R | R3 | - | - | R1 | * | S2 | R2 | S3 | R3 |
| S1 | S | - | R | S | R | S | R | S | R3 | - | - | R1 | * | S2 | R2 | S3 | R3 |
| S1 | R | - | R | S | R | S | R | S | R3 | R1 | - | * | * | S2 | R2 | S3 | R3 |
| S1 | - | S | R | S | R | S | R | S | R3 | - | * | R1 | * | S2 | R2 | S3 | R3 |
| S1 | S | S | R | S | R | S | R | S | R3 | * | * | R1 | * | S2 | R2 | S3 | R3 |
| S1 | R | S | R | S | R | S | R | S | R4 | R1 | S2 | R2 | * | S3 | R3 | S4 | R4 |
| S1 | - | R | R | R | S | R | S | R | R3 | - | R1 | * | * | S2 | R2 | S3 | R3 |
| S1 | S | R | R | R | S | R | S | R | R3 | * | R1 | * | * | S2 | R2 | S3 | R3 |
| S1 | R | R | R | R | S | R | S | R | R3 | R1 | * | * | * | S2 | R2 | S3 | R3 |
| S1 | - | - | - | R | R | R | R | R | R1 | - | - | - | R1 | * | * | * | * |
| S1 | S | - | - | R | R | R | R | R | R1 | * | - | - | R1 | * | * | * | * |
| S1 | R | - | - | R | R | R | R | R | R1 | R1 | - | - | * | * | * | * | * |
| S1 | - | S | - | R | R | R | R | R | R1 | - | * | - | R1 | * | * | * | * |
| S1 | S | S | - | R | R | R | R | R | R1 | * | * | - | R1 | * | * | * | * |
| S1 | R | S | - | R | R | R | R | R | R2 | R1 | S2 | - | R2 | * | * | * | * |
| S1 | - | R | - | R | R | R | R | R | R1 | - | R1 | - | * | * | * | * | * |
| S1 | S | R | - | R | R | R | R | R | R1 | * | R1 | - | * | * | * | * | * |
| S1 | R | R | - | R | R | R | R | R | R1 | R1 | * | - | * | * | * | * | * |
| S1 | - | - | S | R | R | R | R | R | R1 | - | - | * | R1 | * | * | * | * |
| S1 | S | - | S | R | R | R | R | R | R1 | * | - | * | R1 | * | * | * | * |
| S1 | R | - | S | R | R | R | R | R | R2 | R1 | - | S2 | R2 | * | * | * | * |
| S1 | - | S | S | R | R | R | R | R | R1 | - | * | * | R1 | * | * | * | * |
| S1 | S | S | S | R | R | R | R | R | R1 | * | * | * | R1 | * | * | * | * |
| S1 | R | S | S | R | R | R | R | R | R2 | R1 | S2 | * | R2 | * | * | * | * |
| S1 | - | R | S | R | R | R | R | R | R2 | - | R1 | S2 | R2 | * | * | * | * |
| S1 | S | R | S | R | R | R | R | R | R2 | * | R1 | S2 | R2 | * | * | * | * |
| S1 | R | R | S | R | R | R | R | R | R2 | R1 | * | S2 | R2 | * | * | * | * |
| S1 | - | - | R | R | R | R | R | R | R1 | - | - | R1 | * | * | * | * | * |
| S1 | S | - | R | R | R | R | R | R | R1 | * | - | R1 | * | * | * | * | * |
| S1 | R | - | R | R | R | R | R | R | R1 | R1 | - | * | * | * | * | * | * |
| S1 | - | S | R | R | R | R | R | R | R1 | - | * | R1 | * | * | * | * | * |
| S1 | S | S | R | R | R | R | R | R | R1 | * | * | R1 | * | * | * | * | * |
| S1 | R | S | R | R | R | R | R | R | R2 | R1 | S2 | R2 | * | * | * | * | * |
| S1 | - | R | R | R | R | R | R | R | R1 | - | R1 | * | * | * | * | * | * |
| S1 | S | R | R | R | R | R | R | R | R1 | * | R1 | * | * | * | * | * | * |
| S1 | R | R | R | R | R | R | R | R | R1 | R1 | * | * | * | * | * | * | * |

WAVEFORM GENERATOR

CROSS-REFERENCE TO RELATED APPLICATIONS

This application is the U.S. National Stage of International Patent Application No. PCT/JP2008/002443, filed on Sep. 4, 2008, the disclosure of which is incorporated herein by reference.

BACKGROUND OF THE INVENTION

1. Field of the Invention

The present invention relates to a waveform generator that generates an arbitrary waveform.

2. Description of the Related Art

A test apparatus for testing a semiconductor device (hereinafter, referred to as a Device Under Test: DUT) has a function of generating a signal having an arbitrary waveform, which is supplied to the DUT (See Patent Documents 1 to 4).

In FIG. 6 of Patent Document 2, a waveform generator is disclosed, the waveform generator comprising: a set pulse generator that generates a set pulse; a reset pulse generator that generates a reset pulse; and a flip-flop that is set by the set pulse and reset by the reset pulse. According to the technique, in each of the set pulse generator and the reset pulse generator, L multiple variable delay elements that delay pulse signals having the same frequency as the reference clock are provided, where L is an integer of 2 or greater. Different delay amounts are set in the multiple variable delay elements. Outputs from the multiple variable delay elements in the set pulse generator are multiplexed and then inputted to the set terminal of the flip-flop; and outputs from the multiple variable delay elements in the reset pulse generator are multiplexed to be inputted to the reset terminal thereof. By controlling the delay amount of each of the variable delay elements, the flip-flop can output a signal having an arbitrary waveform and having, at most, a frequency obtained by multiplying the reference clock by L.

[Patent Document 1] Japanese Patent Application Publication No. H 10-232271
[Patent Document 2] Japanese Patent Application Publication No. H 11-304888
[Patent Document 3] Japanese Patent Application Publication No. 2000-39469
[Patent Document 4] Japanese Patent Application Publication No. 2006-11287

In the technique in FIG. 6 of Patent Document 2, each of the variable delay elements delays a pulse signal having the same frequency as that of the reference clock. Accordingly, with the same variable delay elements, two delay amounts cannot be set within the frequency of a single reference clock.

This condition is called a "proximity limit" in the present description. In a conventional architecture, when violating the proximity limit, the delay that is set for the second time in the same variable delay circuit has to be neglected, and hence the intended waveform cannot be generated. Also, there occurs a problem that a bit rate of a signal is smaller than a value obtained by multiplying the reference clock by L.

SUMMARY OF THE INVENTION

The present invention has been made in view of these circumstances, and one of the purposes thereof is to provide a waveform generator that can prevent a violation of the proximity limit from occurring.

An embodiment of the present invention relates to a waveform generator. The waveform generator comprises: m variable delay circuits for setting, each of which provides a variable delay to a reference pulse signal in accordance with a set timing signal, where m is an integer of 2 or greater; m variable delay circuits for resetting, each of which provides a variable delay to the reference pulse signal in accordance with the reset timing signal; a flip-flop configured to be set by a multiplexed output signal from the m variable delay circuits for setting, and to be reset by a multiplexed output signal from the m variable delay circuits for resetting; and a waveform shaper configured to receive, at every predetermined cycle, a group of n pieces of timing setting data that include an arbitrary combination of a set timing signal indicating a positive edge timing of an output signal to be generated and a reset timing signal indicating a negative edge timing thereof, where n is an integer of 2 or greater, and configured to assign the group to the m variable delay circuits for setting and the m variable delay circuits for resetting. The waveform shaper includes: a sort unit configured to sort n pieces of the timing setting data in accordance with timing orders indicated by each of the timing setting data; an open processor configured to detect continuation of the set timing signals or continuation of the reset timing signals with reference to n pieces of the timing setting data thus sorted, and configured to invalidate one of the continuous set timing signals and one of the continuous reset timing signals; and an edge assigning unit configured to sequentially assign the set timing signals remaining without being invalidated to, among the m variable delay circuits for setting, the variable delay circuits for setting in the ascending order of the frequencies of use thereof by then, and configured to sequentially assign the reset timing signals remaining without being invalidated to, among the m variable delay circuits for resetting, the variable delay circuits for resetting in the ascending order of the frequencies of use thereof by then.

According to the embodiment, by invalidating the continuous same edge, resources for the variable delay circuits can be secured; and further, by assigning the set timing signals and the reset timing signals to the variable delay circuits in the ascending order of the frequencies of use thereof, the violation of the proximity limit can be prevented from occurring.

The edge assigning unit may sequentially and cyclically assign the set timing signals remaining without being invalidated, to a first variable delay circuit for setting through a m-th variable delay circuit for setting; and sequentially and cyclically assign the reset timing signals remaining without being invalidated, to a first variable delay circuit for resetting through a m-th variable delay circuit for resetting. Because the frequency of use of each delay circuit is equally increased one by one, by cyclically using the plurality of variable delay circuits, the set (/reset) timing signal can always be assigned to the delay circuit, the frequency of use of which is lowest.

Another embodiment of the present invention relates to a test apparatus. The test apparatus comprises the waveform generator stated above.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 6 is a table illustrating state transitions of the waveform shaper in FIG. 1;

BEST MODE FOR CARRYING OUT THE INVENTION

Figure 1:
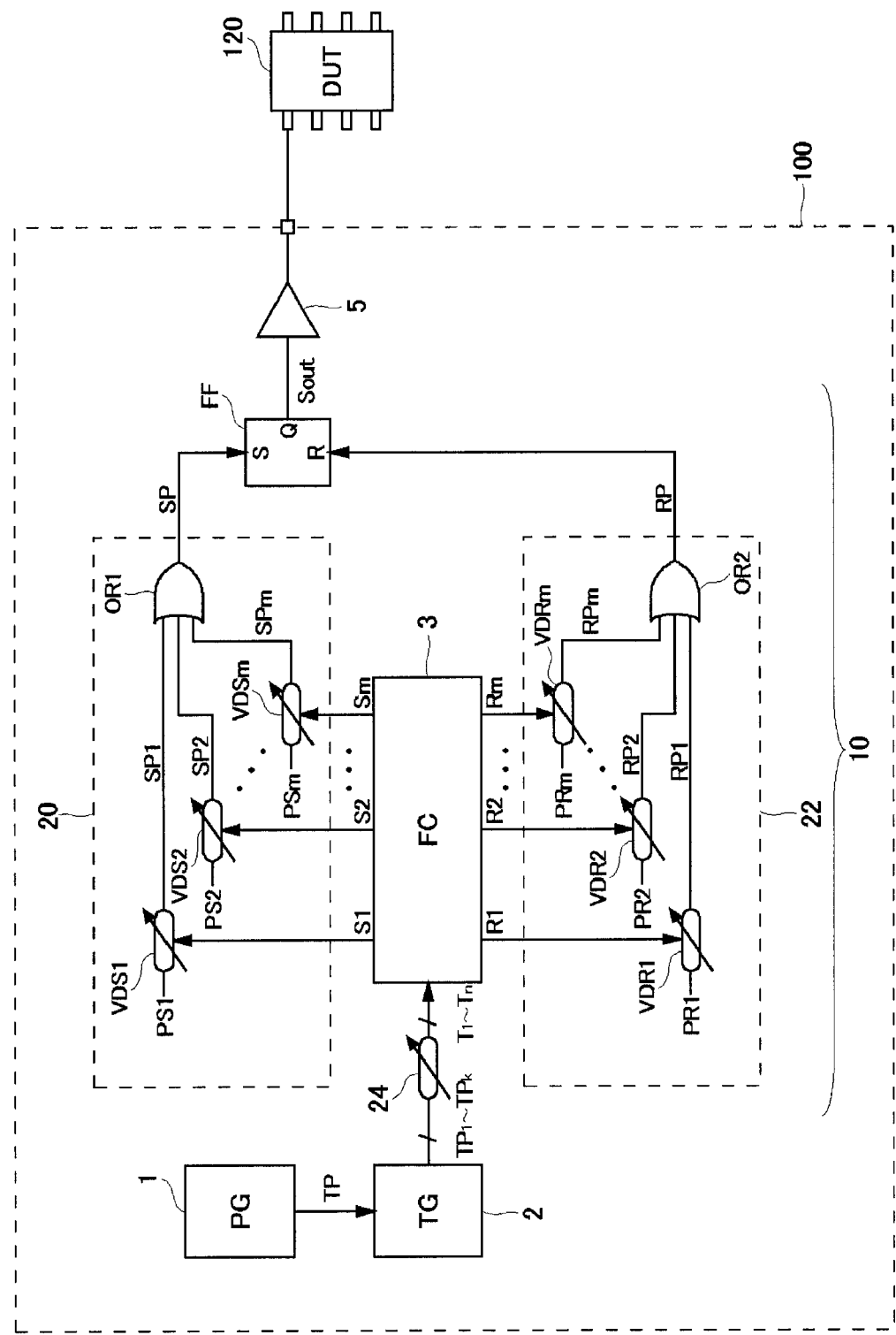
FIG. 1 is a block diagram illustrating the structure of a test apparatus according to an embodiment.

The present invention will be described below with reference to the drawings based on the preferred embodiments. The same or equivalent constituting elements, members and processing illustrated in each drawing shall be denoted by the same reference numerals, and the duplicative explanations will be omitted appropriately. The embodiments do not intend to limit the scope of the present invention, but exemplify the invention. All of the features and the combinations thereof described in the embodiments are not necessarily essential to the invention.

Herein, "the state where a member A is connected to a member B" includes not only the state where the member A is physically and directly connected to the member B but also the state where the member A is indirectly connected to the member B via another member that does not affect electrically the connection state between them. Likewise, "the state where a member C is provided between a member A and a member B" includes not only the state where the member A and the member C, or the member B and the member C, are connected directly, but also the state where they are connected indirectly via another member that does not affect electrically the connection state between them.

FIG. 1 is a block diagram illustrating the structure of a test apparatus 100 according to an embodiment. The test apparatus 100 comprises a pattern generator 1, a timing generator 2, a waveform generator 10 and a driver 5. The pattern generator 1 generates a string of data (test pattern TP) to be supplied to a DUT 120.

The timing generator 2 generates, at every predetermined cycle (hereinafter, referred to as a rate cycle $T_{RATE}$), k pieces of timing setting data $TP_1$ to $TP_k$ that configure timings of a positive edge and a negative edge of an output signal Sout to be supplied to the DUT 120 based on the test pattern TP, where k is a natural number.

A digital circuit inside the test apparatus 100 operates in synchronization with a reference clock REFCLK. The inverse number of the frequency of the reference clock REFCLK is called a reference cycle $T_{REF}$. The reference cycle $T_{REF}$ may be the same as the rate cycle $T_{RATE}$, or the same as a value obtained by multiplying the rate cycle $T_{RATE}$ by an integer or a non-integer (fraction).

Each of the timing setting data $TP_1$ to $TP_k$ can take any one of the following three values:

1. a set timing signal S indicating a positive edge timing of the output signal Sout to be generated by the waveform generator 10;

2. a reset timing signal R indicating a negative edge timing thereof; and 3. empty data E not designating both the positive edge timing and the negative edge timing.

For example, each of the timing setting data $TP_1$ to $TP_K$ may include: a set flag SET, which is asserted (=1) when the data of which is at the positive edge; a reset flag RST, which is asserted when the data of which is at the negative edge; and clock data CD indicating the edge timing. In this case, the timing setting data is indicated as follows: when SET=1 and RST=0, the timing setting data is the set timing signal S; when SET=0 and RST=1, that is the reset timing signal R; and when SET=0 and RST=0, that is the empty data E. It can be understood to those skilled in the art that data formats of the timing setting data is not limited thereto, but another format can be adopted.

The clock data CD of the timing setting data TP can take an arbitrary value between 0 ns and the rate cycle $T_{RATE}$. When the rate cycle $T_{RATE}$ is 4 ns, the clock data CD is set between 0 and 4 ns; and when that is 6 ns, the clock data CD is set between 0 and 6 ns.

The test apparatus 100 adjusts the edge timing of the output signal Sout in two stages. That is, in the preceding stage, a digital delay is provided thereto, with the reference cycle $T_{REF}$ (4 ns) being a unit; and in the subsequent stage, a minute delay (0 to 4 ns) having a shorter cycle than the reference cycle $T_{REF}$ is provided thereto in an analogous way, based on the timing setting data $T_1$ to $T_n$ outputted from a delay circuit 24.

The delay circuit 24 is incorporated for providing a digital coarse delay in the preceding stage. That is, the delay circuit 24 delays, if necessary, the timing setting data $TP_1$ to $TP_k$, with the reference cycle $T_{REF}$ being a unit. The timing of the output signal Sout to be supplied to the DUT 120 is shifted by the delay circuit 24, with the reference cycle $T_{REF}$ being a unit. The delay circuit 24 can be structured with a digital circuit such as a shift register and a counter.

The delay circuit 24 converts the timing setting data TP, which are inputted as a set of k pieces of the timing setting data at every rate cycle $T_{RATE}$, into a set of n pieces of the timing setting data $T_1$ to $T_n$ at every reference cycle $T_{REF}$, and outputs the converted data to the subsequent waveform shaper 3.

When the reference cycles $T_{REF}$ are different from each other, the block in the stage before the timing generator 2 and that in the stage after the waveform shaper 3, are synchronized with each other. The waveform generator 10 receives n pieces of the timing setting data $T_1$ to $T_n$ at every reference cycle $T_{REF}$. The clock data included in the timing setting data $T_1$ to $T_n$ are converted into values between 0 ns and the reference cycle $T_{REF}$.

Figure 2:
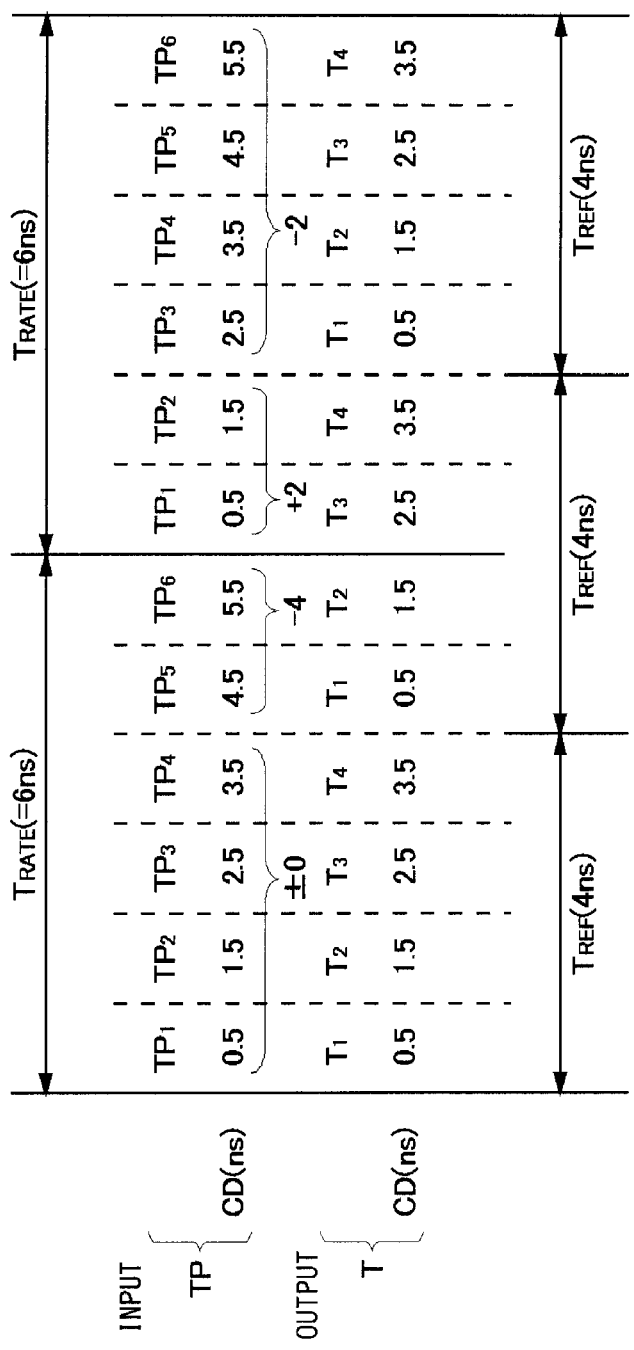
FIG. 2 is a diagram illustrating a state of data conversion by a delay circuit.

FIG. 2 is a diagram illustrating a state of data conversion by the delay circuit 24. In FIG. 2, operations when the reference cycle $T_{REF}$=4 ns and the rate cycle $T_{RATE}$=6 ns, are illustrated. When the reference cycle $T_{REF}$ and the rate cycle $T_{RATE}$ are equal to each other, there is no need for particular processing.

Referring back to FIG. 1, the waveform generator 10 generates the output signal Sout based on the set timing signal S and the reset timing signal R included in the timing setting data $T_1$ to $T_n$. The output signal Sout is supplied to the DUT 120 via the driver 5.

The whole structure of the test apparatus 100 has been described above. Subsequently, the structure of the waveform generator 10 according to the embodiment will be described.

The waveform generator 10 comprises the waveform shaper (Format Controller) 3, a set pulse generator 20, a reset pulse generator 22 and a flip-flop FF.

The set pulse generator 20 includes m variable delay circuits for setting $VDS_1$ to $VDS_m$ and an OR gate OR1, where m is a natural number. The variable delay circuits for setting $VDS_1$ to $VDS_m$ provide variable delays to the reference pulse signals PS1 to PSm synchronized with the reference clock REFCLK, in accordance with the corresponding set timing signals S1 to Sm, respectively. The set pulse signals SP1 to SPm outputted from the m variable delay circuits for setting $VDS_1$ to $VDS_m$ are multiplexed by the OR gate OR1, and the multiplexed set pulse signal SP is supplied to the set terminal of the flip-flop FF in the subsequent stage.

Likewise, the reset pulse generator 22 includes the m variable delay circuits for resetting $VDR_1$ to $VDR_m$ and an OR gate OR2. The variable delay circuits for resetting $VDR_1$ to $VDR_m$ provide variable delays to the reference pulse signals PR1 to PRm having the same frequency as the reference clock REFCLK, in accordance with the corresponding reset timing signals R1 to Rm, respectively. The reset pulse signals RP1 to RPm outputted from the m variable delay circuits for resetting $VDR_1$ to $VDR_m$ are multiplexed by the OR gate OR2, and supplied to the reset terminal of the flip-flop FF in the subsequent stage.

The flip-flop FF is set at the timing of the multiplexed set pulse signal SP, and reset at the timing of the multiplexed reset pulse signal RP.

The waveform shaper 3 receives a set of n pieces of the timing setting data $T_1$ to $T_n$ at every reference cycle $T_{REF}$. As stated above, the timing setting data $T_1$ to $T_n$ includes an arbitrary combination of the set timing signal S indicating the positive edge timing of the output signal Sout to be generated and the reset timing signal R indicating the negative edge timing thereof. The waveform shaper 3 assigns each of the set timing signals S to any one of the m variable delay circuits for setting $VDS_1$ to $VDS_m$. Likewise, the waveform shaper 3 assigns each of the reset timing signals R to any one of the m variable delay circuits for resetting $VDR_1$ to $VDR_m$.

Figure 3:
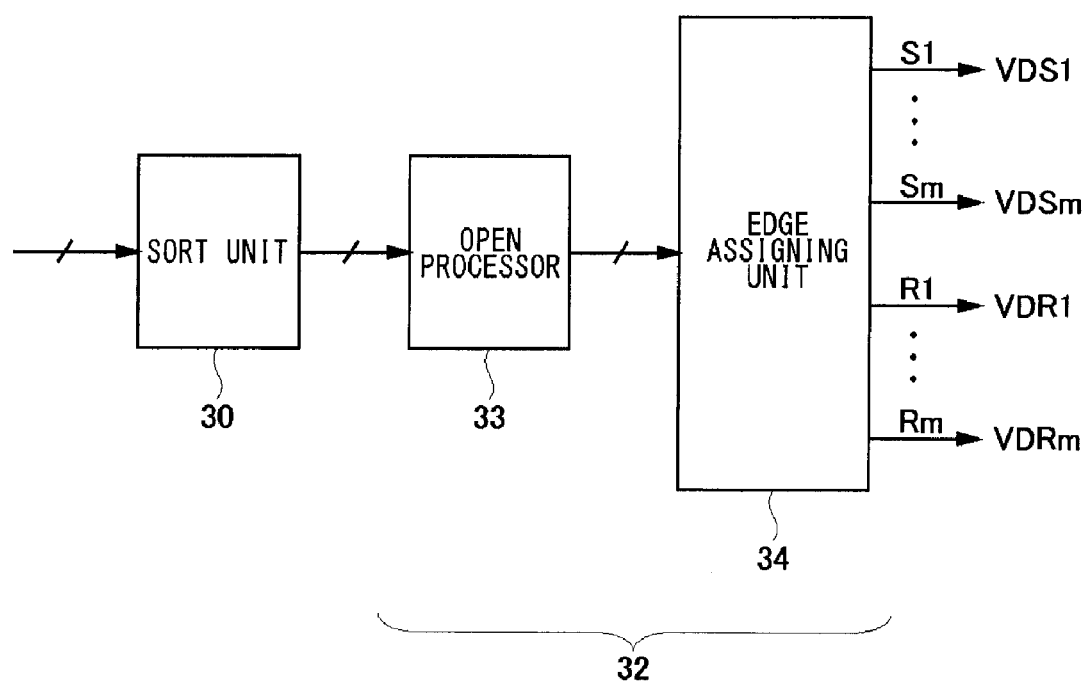
FIG. 3 is a block diagram illustrating the structure of a waveform shaper in FIG. 1.

FIG. 3 is a block diagram illustrating the structure of the waveform shaper 3. The waveform shaper 3 includes a sort unit 30 and an edge controller 32. The sort unit 30 sorts n pieces of the timing setting data $T_1$ to $T_n$ in accordance with the order of the timing indicated by each of the clock data CD.

The edge controller 32 includes an open processor 33 and an edge assigning unit 34. With reference to n pieces of the timing setting data $TS_1$ to $TS_n$ thus sorted, the open processor 33 detects continuation of the set timing signals S and invalidates one of the continuous set timing signals S (in the present embodiment, the "one" means the signal S located later in time). Likewise, the open processor 33 detects continuation of the reset timing signals R such that one of the continuous reset timing signals R is invalid. The continuation of the positive edges and that of the negative edges do not exert a change on a waveform state, and hence, by invalidating one of the edges, it can be prevented that the hardware resources, specifically the variable delay circuit for setting VDS and the variable delay circuit for resetting VDR, are wasted.

The edge assigning unit 34 sequentially assigns the set timing signals S remaining without being invalidated to, among the m variable delay circuits for setting $VDS_1$ to $VDS_m$, the variable delay circuits for setting in the ascending order of the frequencies of use thereof by then. Likewise, the edge assigning unit 34 sequentially assigns the reset timing signals R remaining without being invalidated to, among the m variable delay circuits for resetting $VDR_1$ to $VDR_m$, the variable delay circuits for resetting in the ascending order of the frequencies of use thereof by then.

The edge assigning unit 34 may sequentially and cyclically assign the set timing signals S remaining without being invalidated, to a first variable delay circuit for setting $VDS_1$ to a m-th variable delay circuit for setting $VDS_m$. Likewise, the edge assigning unit 34 may sequentially and cyclically assign the reset timing signals R remaining without being invalidated, to a first variable delay circuit for resetting $VDR_1$ to a m-th variable delay circuit for resetting $VDR_m$. Alternatively, instead of cyclically assigning the signals, the edge assigning unit 34 may sequentially assign the signals in the ascending order of the frequencies of use of the variable delay circuits, based on another rule.

Because the timing setting data $TS_1$ to $TS_n$ inputted to the edge assigning unit 34 are sorted in time and because the continuations of set to set and reset to reset are removed, the set timing signals S and the reset timing signals R are located alternately.

Figure 4:
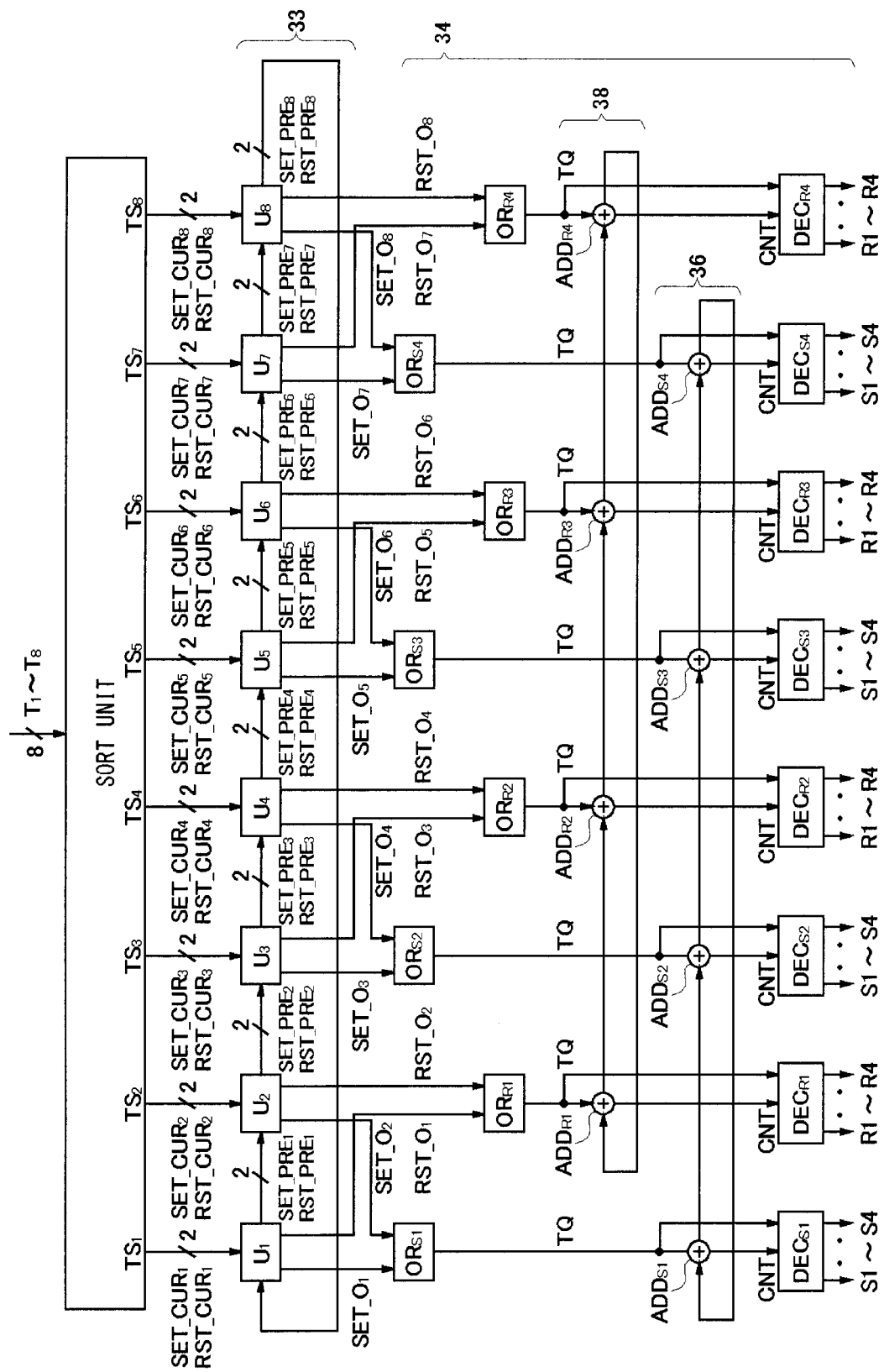
FIG. 4 is a circuit diagram illustrating a specific example of the structure of the waveform shaper in FIG. 3.

FIG. 4 is a circuit diagram illustrating a specific example of the structure of the waveform shaper 3 in FIG. 3. In FIG. 4, description will be made, taking an example where m=4 and n=8.

The sort unit 30 sorts the timing setting data $T_1$ to $T_8$ based on the respective clock data CD. The timing setting data after being sorted are sequentially denoted with $TS_1, TS_2, \ldots TS_8$ in the order that the timing thereof are from earliest to latest.

The sort unit 30: asserts only the set flag $SET_i$ when the i-th timing setting data $TS_i$ after being sorted is the set timing signal S; asserts only the reset flag $RST_i$ when that is the reset timing signal R; and negates (=0) both of the two when that is the empty data E.

The open processor 33 includes processing units $U_1$ to $U_8$ provided for each of the timing setting data $TS_1$ to $TS_8$. The i-th ($1 \leq i \leq 8$) processing unit $U_i$ receives the current set flag $SET\_CUR_i$ and the current reset flag $RST\_CUR_i$ from the sort unit 30.

Further, the i-th (i≠1) processing unit $U_i$ receives the preceding set flag $SET\_PRE_{i-1}$ and the preceding reset flag $RST\_PRE_{i-1}$ from the (i−1)-th processing unit $U_{i-1}$. The first processing unit $U_1$ receives the preceding set flag $SET\_PRE_8$ and the preceding reset flag $RST\_PRE_8$ from the eighth processing unit $U_8$ in the preceding cycle. Because the preceding set flag $SET\_PRE_i$ and the preceding reset flag $RST\_PRE_i$, which corresponds to each other, are asserted complementarily, both can be integrated into a one-bit signal.

The preceding set flag $SET\_PRE_{i-1}$ to be inputted to the i-th processing unit $U_i$ is asserted when the effective edge immediately before the i-th edge is a positive edge. Likewise, the preceding reset flag $SET\_PRE_{i-1}$ is asserted when the effective edge immediately before the i-th edge is a negative edge.

The i-th processing unit $U_i$ executes the following processing, where i−1=8 when i=1:

(1) $SET\_CUR_i=1$, $RST\_CUR_i=0$, $SET\_PRE_{i-1}=1$ and $RST\_PRE_{i-1}=0$

This state indicates a continuous sequence of set to set. The processing unit $U_i$ negates an output set flag $SET\_O_i$ to invalidate the corresponding timing setting data $TS_i$ (set timing signal S). Also, the processing unit $U_i$ negates an output reset flag $RST\_O_i$. Further, the processing unit $U_i$ asserts the preceding set flag $SET\_PRE_i$ and negates the preceding reset flag $RST\_PRE_i$, which correspond to the (i+1)-th processing unit $U_{i+1}$.

(2) $SET\_CUR_i=1$, $RST\_CUR_i=0$, $SET\_PRE_{i-1}=0$ and $RST\_PRE_{i-1}=1$

This state indicates a continuous sequence of reset to set. The processing unit $U_i$ asserts the output set flag $SET\_O_i$ to validate the corresponding timing setting data $TS_i$ (set timing signal S). Also, the processing unit $U_i$ negates the output reset flag $RST\_O_i$. Further, the processing unit $U_i$ asserts the preceding set flag $SET\_PRE_i$ and negates the preceding reset flag $RST\_PRE_i$, which correspond to the (i+1)-th processing unit $U_{i+1}$.

(3) $SET\_CUR_i=0$, $RST\_CUR_i=1$, $SET\_PRE_{i-1}=1$ and $RST\_PRE_{i-1}=0$

This state indicates a continuous sequence of set to reset. The processing unit $U_i$ asserts the output reset flag $RST\_O_i$ to validate the corresponding timing setting data $TS_i$ (reset timing signal R). Also, the processing unit $U_i$ negates the output set flag $SET\_O_1$. Further, the processing unit $U_i$ asserts the preceding reset flag $RST\_PRE_i$ and negates the preceding set flag $SET\_PRE_i$, which correspond to the (i+1)-th processing unit $U_{i+1}$.

(4) $SET\_CUR_i=0$, $RST\_CUR_i=1$, $SET\_PRE_{i-1}=0$ and $RST\_PRE_{i-1}=1$

This state indicates a continuous sequence of reset to reset. The processing unit $U_i$ negates the output reset flag $RST\_O_i$ to invalidate the corresponding timing setting data $TS_i$ (reset timing signal R). Also, the processing unit $U_i$ negates the output set flag $SET\_O_i$. Further, the processing unit $U_i$ asserts the preceding reset flag $RST\_PRE_i$ and negates the preceding set flag $SET\_PRE_i$, which correspond to the (i+1)-th processing unit $U_{i+1}$.

(5) $SET\_CUR_i=0$, $RST\_CUR_i=0$, $SET\_PRE_{i-1}=1$ and $RST\_PRE_{i-1}=0$

This state indicates a continuous sequence of set to empty data. The processing unit $U_1$ negates both of the output reset flag $RST\_O_i$ and the output set flag $SET\_O_i$. Further, the processing unit $U_i$ asserts the preceding set flag $SET\_PRE_i$ and negates the preceding reset flag $RST\_PRE_i$, which correspond to the (i+1)-th processing unit $U_{i+1}$.

(6) $SET\_CUR_i=0$, $RST\_CUR_i=0$, $SET\_PRE_{i-1}=0$ and $RST\_PRE_{i-1}=1$

This state indicates a continuous sequence of reset to empty data. The processing unit $U_i$ negates both of the output reset flag $RST\_O_i$ and the output set flag $SET\_O_i$. Further, the processing unit $U_i$ asserts the preceding reset flag $RST\_PRE_i$ and negates the preceding set flag $SET\_PRE_i$, which correspond to the (i+1)-th processing unit $U_{i+1}$.

According to the open processor 33 having the structure, the continuation of the set timing signals S or that of the reset timing signals R, can be detected such that one of the continuous set timing signals or one of the continuous reset timing signals is invalidated.

The edge assigning unit 34 includes OR gates $OR_{S1}$ to $OR_{S4}$ and $OR_{R1}$ to $OR_{R4}$, a first counter 36, a second counter 38 and decoders $DEC_{S1}$ to $DEC_{S4}$ and $DEC_{R1}$ to $DEC_{R4}$.

The i-th ($1 \leq i \leq 4$) OR gate $OR_{Si}$ outputs a logical sum of the output set flag $SET\_O_{2 \times i-1}$ from the (2×i−1)-th processing unit $U_{2 \times i-1}$ and the output set flag $SET\_O_{2 \times i}$ from the (2×i)-th processing unit $U_{2 \times i}$. The i-th ($1 \leq i \leq 4$) OR gate $OR_{Ri}$ outputs a logical sum of the output reset flag $RST\_O_i$ from the i-th processing unit $U_i$ and the output reset flag $RST\_O_{i+1}$ from the (i+1)-th processing unit $U_{i+1}$.

The first counter 36 is provided for managing which variable delay circuit for setting VDS the set timing signal S is assigned to. Likewise, the second counter 38 is provided for managing which variable delay circuit for resetting VDR the reset timing signal R is assigned to.

The first counter 36 includes adders $ADD_{S1}$ to $ADD_{S4}$ associated with the four OR gates $OR_{S1}$ to $OR_{S4}$. The i-th ($2 \leq i \leq 4$) adder $ADD_{Si}$ adds a count value $CNT_{Si}$ of the (i−1)-th adder $ADD_{Si-1}$ in the preceding cycle, with an output signal $TQ_{Si}$ from the corresponding OR gate $OR_{Si}$ in the current cycle. The first adder $ADD_{S1}$ adds a count value [1:0] of the fourth adder $ADD_{S4}$ in the preceding cycle, with an output signal $TQ_{S1}$ from the corresponding OR gate $OR_{S1}$ in the current cycle.

The second counter 38 includes adders $ADD_{R1}$ to $ADD_{R4}$ associated with the four OR gates $OR_{R1}$ to $OR_{R4}$. Operations of the adders $ADD_{R1}$ to $ADD_{R4}$ are the same as those $ADD_{S1}$ to $ADD_{S4}$ of first counter 36.

The decoders $DEC_{S1}$ to $DEC_{S4}$ receive the output signals TQ from the corresponding OR gates $OR_{S1}$ to $OR_{S4}$, and the count values CNT of the corresponding adders $ADD_{S1}$ to $ADD_{S4}$, respectively. When the output value TQ from the corresponding OR gate $OR_{Si}$ is 1, the i-th decoder $DEC_{Si}$ assigns the set timing signal S to the variable delay circuit for setting VDS corresponding to the count value CNT of the adder $ADD_{Si}$.

The decoders $DEC_{R1}$ to $DEC_{R4}$ are the same as those $DEC_{S1}$ to $DEC_{S4}$. That is, when a value of the corresponding OR gate $OR_{Ri}$ is 1, the i-th decoder $DEC_{Ri}$ assigns the reset timing signal to the variable delay circuit for setting VDR corresponding to the count value of the adder $ADD_{Ri}$.

Figure 5:
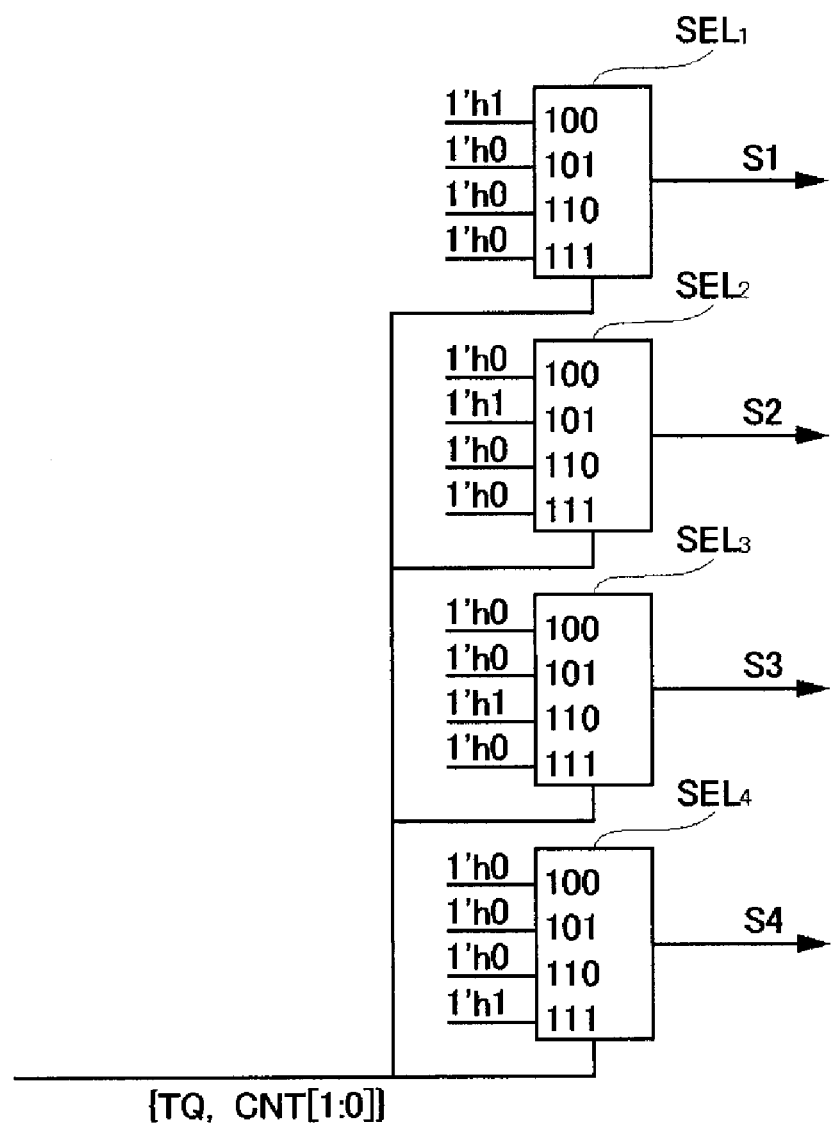
FIG. 5 is a circuit diagram illustrating an example of the structure of a decoder in FIG. 4.

FIG. 5 is a circuit diagram illustrating an example of the structure of the decoder in FIG. 4. The decoder $DEC_S$ includes m selectors $SEL_1$ to $SEL_m$ where m is 4. Each of the selectors $SEL_1$ to $SEL_m$ is inputted with {TQ, CNT [1:0]} as a control signal. Because TQ is 1 bit and CNT [1:0] is 2 bits, the control signal becomes 3 bits.

The j-th ($1 \leq j \leq 4$) selector $SEL_j$ selects input data corresponding to the control signal {TQ, CNT [1:0]}, and then outputs it as data $S_j$.

4-bit outputs S1 to S4 outputted from the decoder $DEC_{Si}$ indicates a place to which the set timing signal S included in either one of the corresponding timing setting data $TS_{2 \times i-1}$ and $TS_{2 \times i}$, is asserted.

When TQ=0, S1=S2=S3=S4=0 holds. That is, the set timing signal S is not assigned to anyone of the variable delay circuits for setting VDS. When TQ=1, any one of S1 to S4, which corresponds to 4-bit CNT [1:0], is asserted. When the j-th output $S_j$ is asserted, the set timing signal S is assigned to the j-th variable delay circuit for setting $VDS_j$.

The decoder $DEC_R$ is structured in the same way as the decoder $DEC_S$. The decoder $DEC_{Ri}$ outputs 4-bit outputs R1 to R4 indicating a place to which the reset timing signal R included in either one of the corresponding timing setting data $TS_{2 \times i-1}$ and $TS_{2 \times i}$. When the j-th output $R_j$ is asserted, the reset timing signal R is assigned to the j-th variable delay circuit for resetting $VDR_j$.

The structure of the test apparatus 100 has been described above. Subsequently, operations thereof will be described. FIG. 6 is a table illustrating state transitions of the waveform shaper 3. The "input" in the left column indicates values of the sorted timing setting data $TS_1$ to $TS_8$ and the latest assigned place in the past (count value CNT). The set timing signal of the timing setting data TS is represented by "S", the reset timing signal thereof is by "R" and the empty data E is by "−". The state where the count value CNT is "S1" indicates that the place to which the timing setting data TS has been finally assigned is the variable delay circuit for setting $VDS_1$. In FIG. 6, only the state transitions, the starting points of which are the states where the count value CNT is "S1", are illustrated.

The "assigned place" in the right column indicates the variable delay circuits for setting VDS or the variable delay circuits for resetting VDR, to which the timing setting data $TS_1$ to $TS_8$ are assigned. "*" indicates the edge invalidated by the open processor 33.

Figure 7:
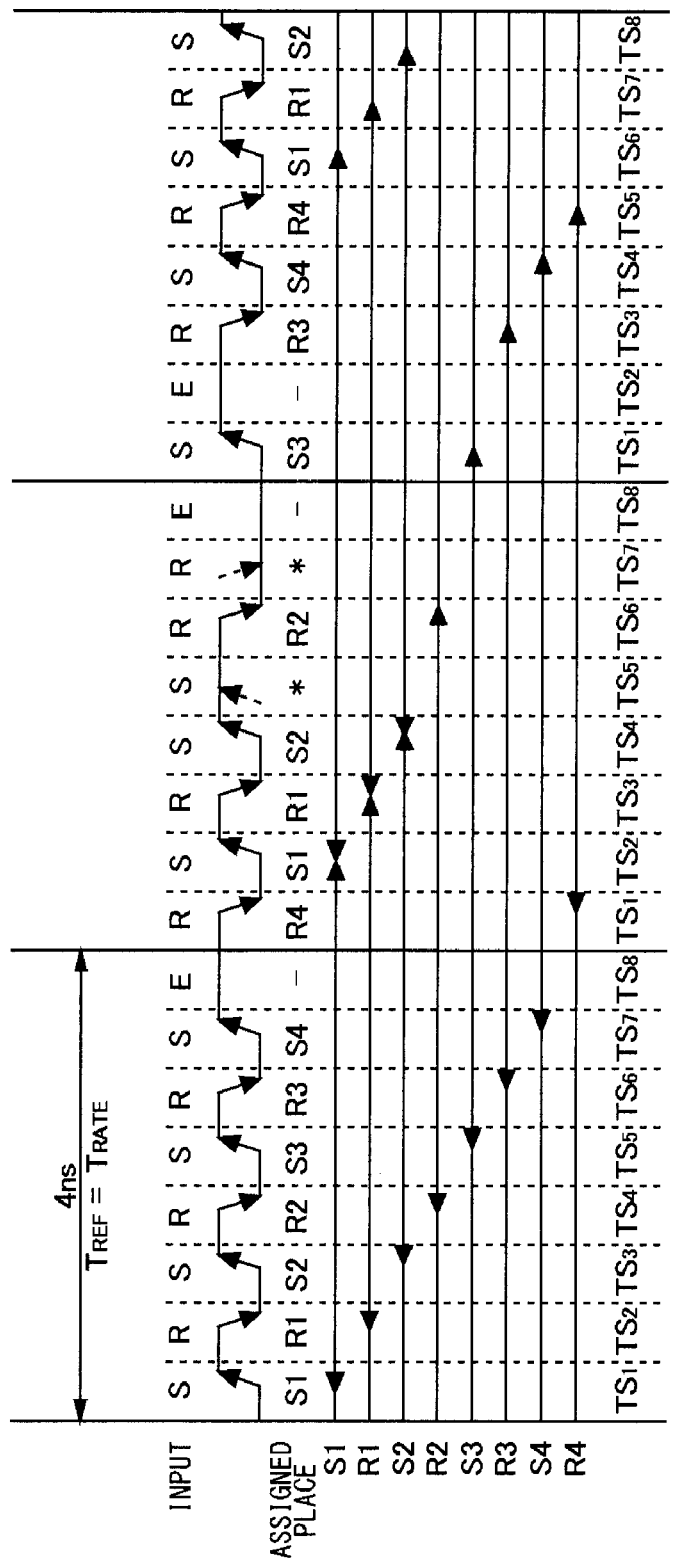
FIG. 7 is a time chart illustrating operations of the waveform generator in FIG. 1.
Figure 8:
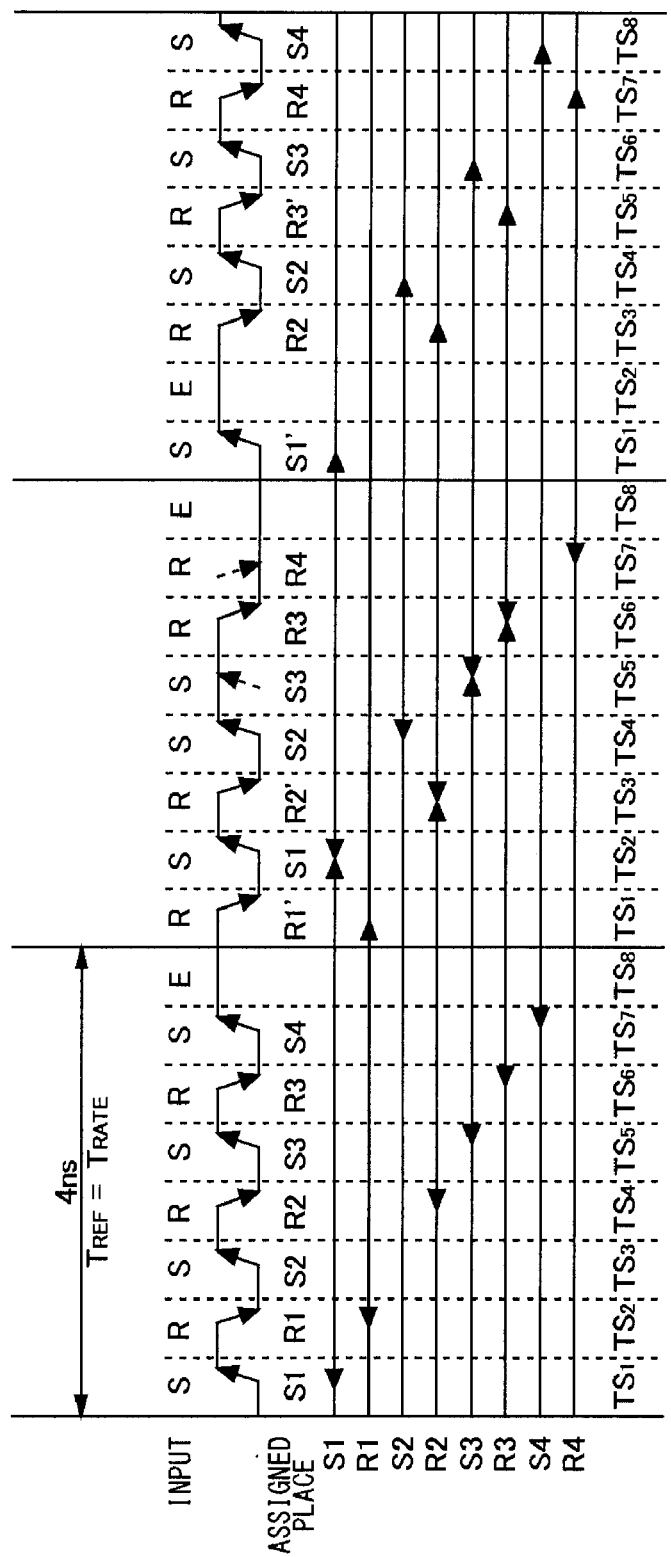
FIG. 8 is a time chart of a waveform generator using a conventional architecture.

Advantages of the waveform generator 10 according to the embodiments will become clear by the following description. FIG. 7 is a time chart illustrating operations of the waveform generator 10 in FIG. 1. FIG. 8 is a time chart of a waveform generator using a conventional architecture.

Referring to FIG. 8 at first, when a conventional architecture is used, the set timing signals S are sequentially assigned to S1, S2, S3 and S4, and the reset timing signals R are sequentially assigned to R1, R2, R3 and R4, in the same reference cycle $T_{REF}$. When moving to the next reference cycle $T_{REF}$, the signals S and the signals R are again assigned sequentially from the first signals S1 and R1. If the processing by which the continuous same edges are cancelled (invalidated) is not performed, the edges not affecting the waveform (indicated by dashed lines in the drawing) occupy the resources (variable delay circuits), becoming uneconomical.

As a result, a time interval when the same resource is used becomes shorter than the reference cycle $T_{REF}$ as illustrated in FIG. 8, thereby causing a violation of the proximity limit. For example, the resource S1 causes the violation of the proximity limit between the second cycle and third cycle; and the resource R1 causes that between the first cycle and the second cycle. In FIG. 8, the edge at which the violation of the proximity limit occurs is denoted with "". When the violation of the proximity limit occurs, an edge to be essentially generated in the subsequent cycle cannot be generated, and hence the intended waveform cannot be generated.

Subsequently, referring to FIG. 7, the waveform shaper 3 according to the embodiment cancels the continuous same edges, thereby preventing the resource from being wasted. The cancelled edge is represented by "*". Further, allowing the signals to be assigned across cycles, the set timing signals S are sequentially assigned to the resources S1, S2, S3, S4, S1 and S2 . . . , and the reset timing signals R are sequentially assigned to the resources R1, R2, R3, R4, R1 and R2 . . . . For example, specifically, the reset timing signal R at the head of the second cycle is assigned to the resource R4, not to the resource R1.

With reference to FIG. 7, it can be understood that each use interval with respect to all the resources is longer than the reference cycle TREF. That is, according to the waveform shaper 3 of the embodiment, by preventing the violation of the proximity limit from occurring, a decrease in bit rate can be suppressed, allowing the waveform to be essentially generated, to be outputted.

The present invention has been described based on the embodiments, which is only intended to illustrate the principle and applications of the invention, and a variety of modifications and variations in arrangement may be made to the embodiments within the range not departing from the spirit of the invention specified in appended claims.

The invention claimed is:

1. A waveform generator comprising:
   m variable delay circuits for setting, each of which is configured to provide a variable delay to a reference pulse signal in accordance with a set timing signal, where m is an integer of 2 or greater;
   m variable delay circuits for resetting, each of which is configured to provide a variable delay to the reference pulse signal in accordance with the reset timing signal;
   a flip-flop configured to be set by a multiplexed output signal from the m variable delay circuits for setting, and to be reset by a multiplexed output signal from the m variable delay circuits for resetting; and
   a waveform shaper configured to receive, at every predetermined cycle, a group of n pieces of timing setting data that include an arbitrary combination of a set timing signal indicating a positive edge timing of an output signal to be generated and a reset timing signal indicating a negative edge timing thereof, where n is an integer of 2 or greater, and configured to assign the group to the m variable delay circuits for setting and the m variable delay circuits for resetting, wherein the waveform shaper includes: a sort unit configured to sort n pieces of the timing setting data in accordance with timing orders indicated by each of the timing setting data; an open processor configured to detect continuation of the set timing signals or continuation of the reset timing signals with reference to n pieces of the timing setting data thus sorted, and configured to invalidate one of the continuous set timing signals and one of the continuous reset timing signals;
   and an edge assigning unit configured to sequentially assign the set timing signals remaining without being invalidated to, among the m variable delay circuits for setting, the variable delay circuits for setting in the ascending order of the frequencies of use thereof by then, and configured to sequentially assign the reset timing signals remaining without being invalidated to, among the m variable delay circuits for resetting, the variable delay circuits for resetting in the ascending order of the frequencies of use thereof by then.

2. The waveform generator according to claim 1, wherein the edge assigning unit sequentially and cyclically assigns the set timing signals remaining without being invalidated, to a first variable delay circuit for setting through a m-th variable delay circuit for setting; and sequentially and cyclically assigns the reset timing signals remaining without being invalidated, to a first variable delay circuit for resetting through a m-th variable delay circuit for resetting.

3. The waveform generator according to claim 2, wherein the edge assigning unit includes a first counter configured to manage which variable delay circuit for setting the set timing signal is assigned to, and a second counter configured to manage which variable delay circuit for resetting the reset timing signal is assigned to.

4. The waveform generator according to claim 1, wherein the edge assigning unit includes a first counter configured to manage which variable delay circuit for setting the set timing signal is assigned to, and a second counter configured to manage which variable delay circuit for resetting the reset timing signal is assigned to.

5. A test apparatus comprising a waveform generator, wherein the waveform generator comprises:
   m variable delay circuits for setting, each of which is configured to provide a variable delay to a reference pulse signal in accordance with a set timing signal, where m is an integer of 2 or greater;
   m variable delay circuits for resetting, each of which is configured to provide a variable delay to the reference pulse signal in accordance with the reset timing signal;
   a flip-flop configured to be set by a multiplexed output signal from the m variable delay circuits for setting, and to be reset by a multiplexed output signal from the m variable delay circuits for resetting; and
   a waveform shaper configured to receive, at every predetermined cycle, a group of n pieces of timing setting data that include an arbitrary combination of a set timing signal indicating a positive edge timing of an output signal to be generated and a reset timing signal indicating a negative edge timing thereof, where n is an integer of 2 or greater, and configured to assign the group to the m variable delay circuits for setting and the m variable delay circuits for resetting, wherein the waveform shaper includes: a sort unit configured to sort n pieces of the timing setting data in accordance with timing orders indicated by each of the timing setting data; an open processor configured to detect continuation of the set timing signals or continuation of the reset timing signals with reference to n pieces of the timing setting data thus sorted, and configured to invalidate one of the continuous set timing signals and one of the continuous reset timing signals; and an edge assigning unit configured to sequentially assign the set timing signals remaining without being invalidated to, among the m variable delay circuits for setting, the variable delay circuits for setting in the ascending order of the frequencies of use thereof by then, and configured to sequentially assign the reset timing signals remaining without being invalidated to, among the m variable delay circuits for resetting, the variable delay circuits for resetting in the ascending order of the frequencies of use thereof by then.

6. A test apparatus comprising a waveform generator, wherein the waveform generator comprises:
   m variable delay circuits for setting, each of which is configured to provide a variable delay to a reference pulse signal in accordance with a set timing signal, where m is an integer of 2 or greater;
   m variable delay circuits for resetting, each of which is configured to provide a variable delay to the reference pulse signal in accordance with the reset timing signal;
   a flip-flop configured to be set by a multiplexed output signal from the m variable delay circuits for setting, and to be reset by a multiplexed output signal from the m variable delay circuits for resetting; and a waveform shaper configured to receive, at every predetermined cycle, a group of n pieces of timing setting data that include an arbitrary combination of a set timing signal indicating a positive edge timing of an output signal to be generated and a reset timing signal indicating a negative edge timing thereof, where n is an integer of 2 or greater, and configured to assign the group to the m variable delay circuits for setting and the m variable delay circuits for resetting, wherein the waveform shaper includes: a sort unit configured to sort n pieces of the timing setting data in accordance with timing orders indicated by each of the timing setting data; an open processor configured to detect continuation of the set timing signals or continuation of the reset timing signals with reference to n pieces of the timing setting data thus sorted, and configured to invalidate one of the continuous set timing signals and one of the continuous reset timing signals; and an edge assigning unit configured to sequentially assign the set timing signals remaining without being invalidated to, among the m variable delay circuits for setting, the variable delay circuits for setting in the ascending order of the frequencies of use thereof by then, and configured to sequentially assign the reset timing signals remaining without being invalidated to, among the m variable delay circuits for resetting, the variable delay circuits for resetting in the ascending order of the frequencies of use thereof by then,
wherein the edge assigning unit sequentially and cyclically assigns the set timing signals remaining without being invalidated, to a first variable delay circuit for setting through a m-th variable delay circuit for setting; and sequentially and cyclically assigns the reset timing signals remaining without being invalidated, to a first variable delay circuit for resetting through a m-th variable delay circuit for resetting.

* * * * *